United States Patent [19]

Cotner et al.

[11] Patent Number: 5,243,494

[45] Date of Patent: Sep. 7, 1993

[54] PHYSICALLY RECONFIGURABLE INTERACTIVE CONTROL SYSTEM

[75] Inventors: Holly Cotner, St. Paul; Dan Miles, Minneapolis; Tom Halvorsen, Blaine, all of Minn.

[73] Assignee: Hughes Training, Inc., Arlington, Tex.

[21] Appl. No.: 962,088

[22] Filed: Oct. 16, 1992

Related U.S. Application Data

[63] Continuation of Ser. No. 721,857, Jun. 25, 1991, abandoned.

[51] Int. Cl.$^5$ .......................... H05K 7/08; F16M 13/00
[52] U.S. Cl. ........................................ 361/728; 248/558; 361/600; 361/679
[58] Field of Search ............... 248/220.3, 558; 361/331, 334, 346, 356, 357, 359, 362, 363, 380, 392, 395, 427

[56] References Cited

U.S. PATENT DOCUMENTS

| | | | |
|---|---|---|---|
| 2,526,901 | 10/1950 | Robbins | 361/356 |
| 2,592,552 | 4/1952 | deFlorez et al. | 361/346 X |
| 3,606,019 | 9/1971 | Dubiel | 361/346 X |
| 4,270,820 | 6/1981 | McMullan et al. | 361/380 X |
| 4,600,355 | 7/1986 | Johnson | 248/558 X |
| 4,642,888 | 2/1987 | Love | 361/346 X |
| 4,667,270 | 5/1987 | Yagi | 361/380 |
| 4,851,962 | 7/1989 | Dard et al. | 361/334 |
| 5,010,438 | 4/1991 | Brady | 361/363 X |

OTHER PUBLICATIONS

Equipto Electronics Corporation, Catalog #500-4, p. H-3, copyright 1990.

*Primary Examiner*—Leo P. Picard
*Assistant Examiner*—Michael W. Phillips
*Attorney, Agent, or Firm*—Wanda K. Denson-Low

[57] ABSTRACT

A reconfigurable control system (10) enabling a designer to layout, configure and test control panel designs includes an enclosure base (12), a matrix panel (14) and a plurality of modules (34) which are adapted to receive at least one control panel element. The base (44) of each module (34) has a plurality of holes (46) which align with corresponding apertures (22) provided in the matrix panel (14). A fastener (24) is passed through the aligning apertures (22, 46) of the matrix panel (14) and module (34), respectively, to provide removable mounting.

17 Claims, 3 Drawing Sheets

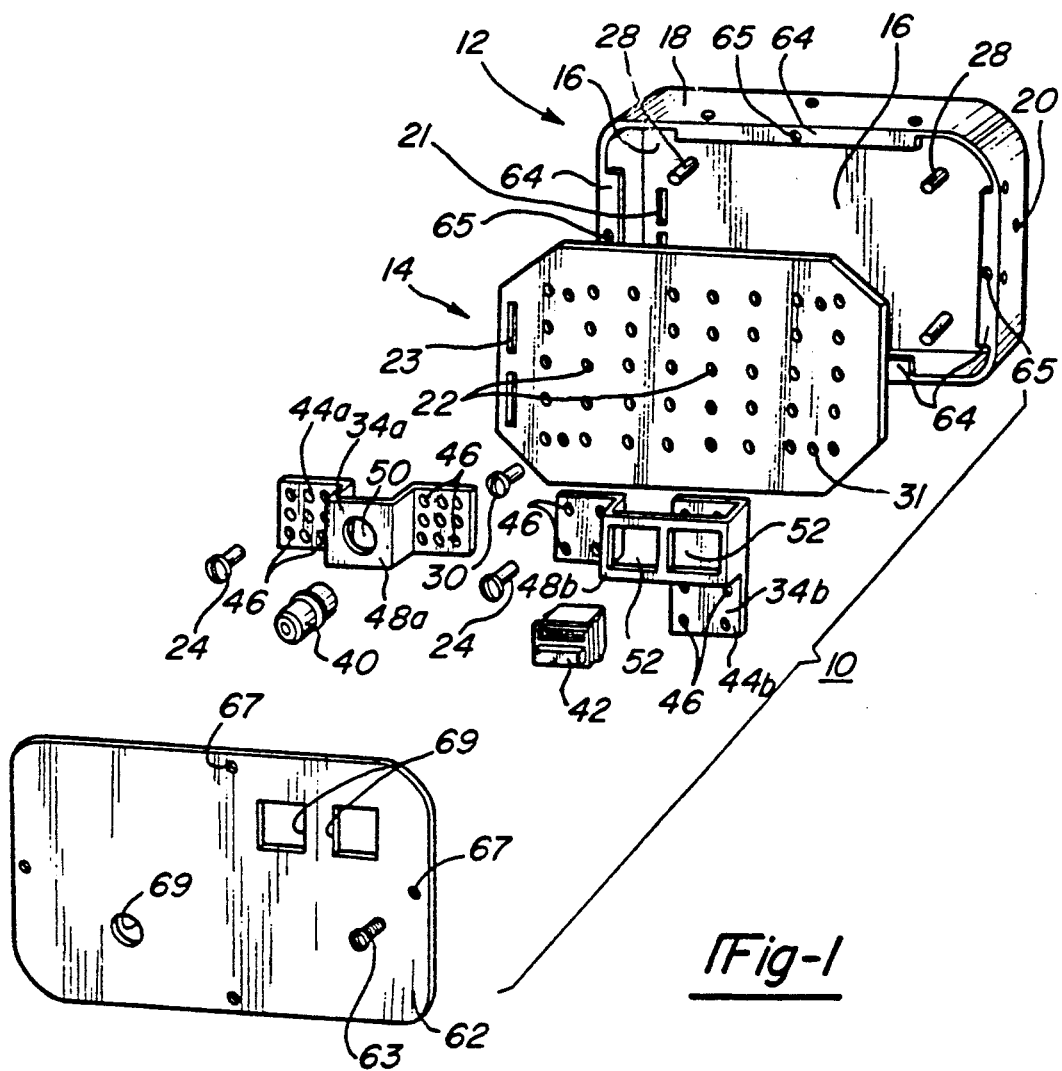

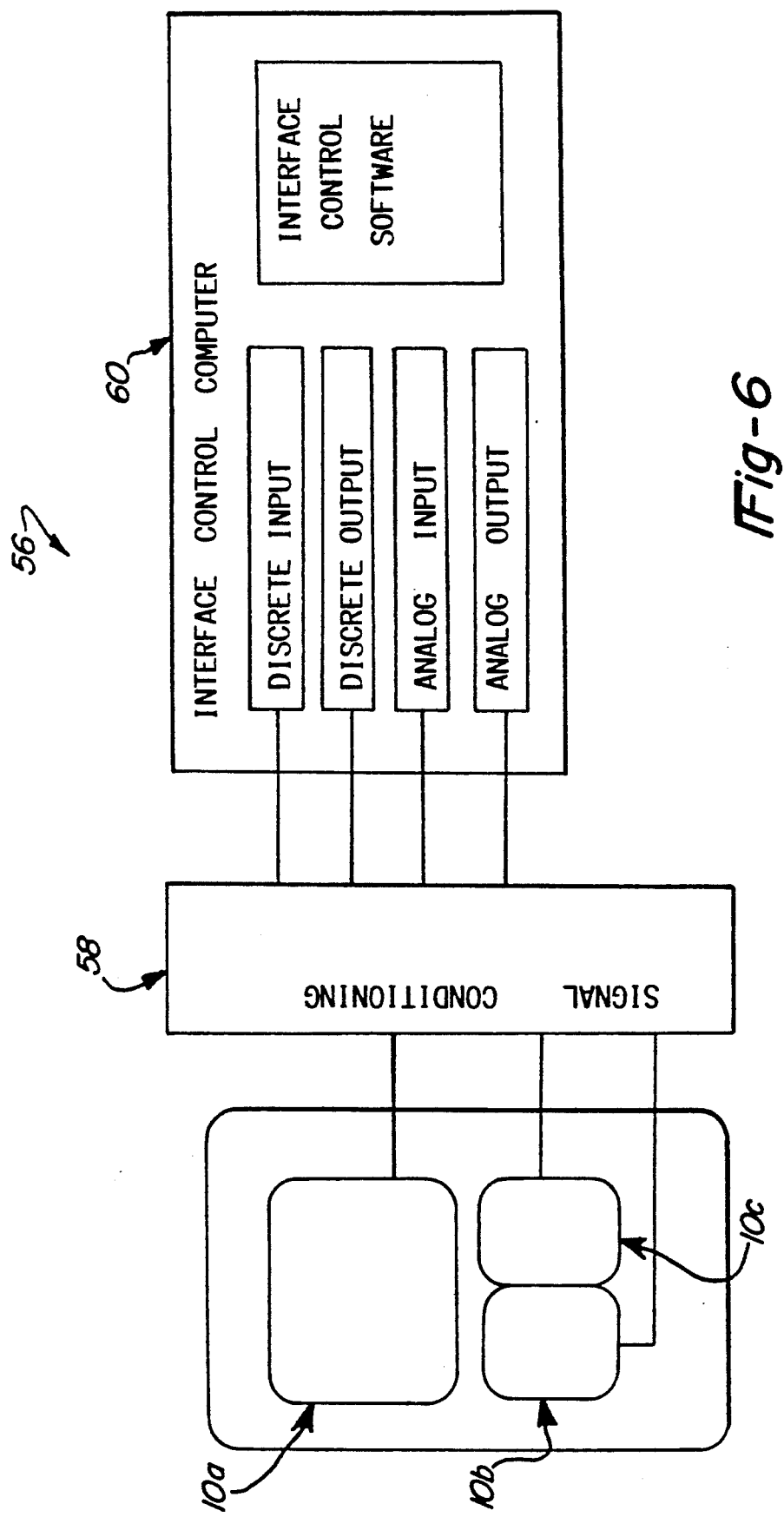

PHYSICALLY RECONFIGURABLE INTERACTIVE CONTROL SYSTEM

This is a continuation of application Ser. No. 07/721,857, filed Jun. 25, 1991, now abandoned.

BACKGROUND OF THE INVENTION

1. Technical Field

The present invention relates to a system for designing a control panel and, more particularly, to a reconfigurable control system which facilitates the layout, configuration, and testing of control panels.

2. Discussion

Control panel layouts are currently designed by several methods. The most common method of designing control panels is through layout of a design which is drawn on paper with drafting tools or by computer aided design. In such a method, the two-dimensional designs developed on paper or computer can be incorporated into a prototype. One problem with this method is that it does not promote refinement or experimentation with a physical design layout due to prohibitive costs for the redesigning and building of prototypes.

With the advent of computer graphics, control panels may alternatively be designed to incorporate interactive computer displays. This interaction with the computer simulated control panel is made possible through the application of interactive devices such as touch sensitive panels overlaying the computer screen or other external pointing devices. This particular design method enables one to quickly reconfigure a simulated panel through the reprogramming of the display, at a relatively modest cost. However, such a technique is not without its own drawbacks. For example, computer graphics with interactive computer displays offer extremely low physical fidelity for interactions with a simulated control panel.

Accordingly, it is a primary objective of the present invention to combine the flexibility and cost effectiveness of a computer assisted simulation control panel with the high physical fidelity of a prototype.

Another object of the present invention is to provide an inexpensive means to design and experiment with control panel layouts in a high-fidelity environment.

A further object of the present invention is to provide a reconfigurable system for control panel design and testing in which control panel elements can be moved quickly and easily, either independently or within small groupings of elements.

SUMMARY OF THE INVENTION

In accordance with the teachings of the present invention there is provided a physically reconfigurable interactive control system (PHRICS) for designing and testing a control panel layout. The system includes an enclosure base, a matrix panel mountable to the base having a plurality of apertures, at least one module and means for mounting the module on the matrix panel. The module includes a base having a plurality of apertures and a top adapted to receive at least one control panel element. At least one aperture formed in the base of the module will align and mate with at least one aperture located in the matrix panel. A fastener is projectable through the mating apertures to enable removable mounting.

The present invention provides a system in which control panel elements including switches, indicators, gages, and other interface components can be mounted into modules which are positioned on a matrix panel, which thereby allows discrete changes in position and orientation. The modules are releasably fastened to the matrix panel by quick release fasteners to improve physical reconfigurability. Control panel elements may be easily and quickly interchanged between modules. The functions of the interface components are defined and controlled by software.

BRIEF DESCRIPTION OF THE DRAWINGS

Various other features, objects, and details of the present invention will become apparent from the following detailed description, when read in conjunction with the accompanying drawings in which:

FIG. 1 is an exploded perspective view of a system made in accordance with the preferred embodiment of the present invention including a four position switch and a split legend push button switch as illustrative control panel elements;

FIG. 2 is a front view of the base and matrix panel of the present invention including a four position switch and a split legend push button switch as illustrative control panel elements;

FIG. 6 is a block diagram of the preferred electrical interface for the present invention.

DETAILED DESCRIPTION OF THE PREFERRED EMBODIMENT

Figure 3:
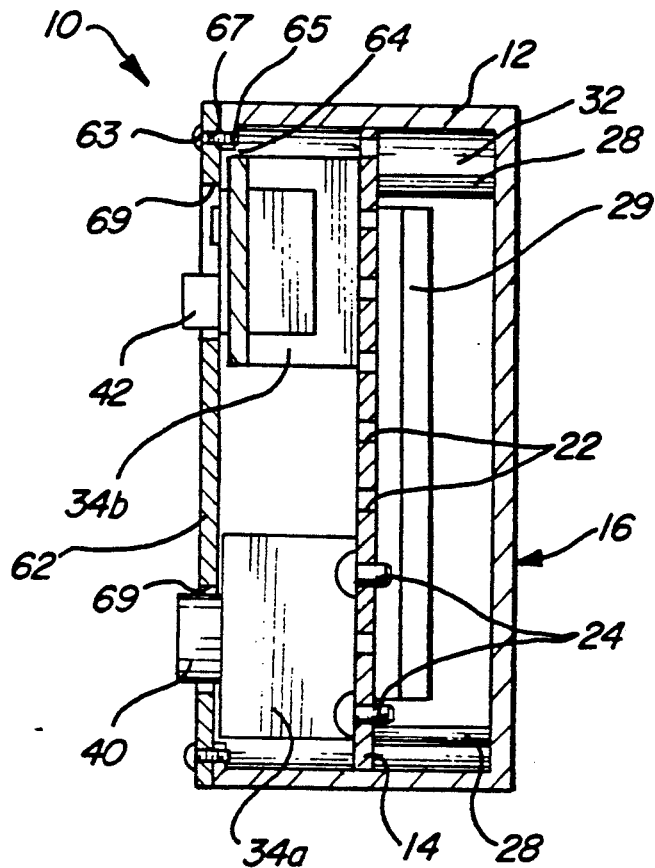
FIG. 3 is a sectional view taken along the lines 3—3 of FIG. 2.

As generally shown in FIGS. 1 through 3, the reconfigurable system 10 for designing a control panel includes an enclosure base 12 and a matrix panel 14. In the preferred embodiment, the enclosure base 12 is a rectangular, deep drawn aluminum can, having a back 16 and four sides 18. Apertures 20 are provided in the sides 18 of the base 12 so that the base 12 may be attached to another substantially similar base, in order to enlarge the working area (see, modules systems 10b and 10c in FIG. 6). The depth of the sides 18 of the base 12 in the preferred embodiment is three inches. Cut-outs 21 and 23 are provided in both the back 16 of the base 12 and the matrix panel 14 to accommodate the mounting of an electrical connector, which is typically a DB-25 connector for connection to signal conditioning circuitry and a computer interface. This interface, which is illustrated in FIG. 6 will be described in further detail below.

The matrix panel 14 of the present invention is cut from ⅛ inch aluminum sheets and sized to fit loosely within the enclosure base 12. This sizing enhances ease of interchangability. In the preferred embodiment, the matrix panel 14 is perforated with an array of 0.440" diameter apertures 22, 1" on center. The apertures 22 are sized to accommodate fractional turn fasteners 24, which will be discussed in further detail below. An electrical wiring harness 29 can be mounted to the rear of the matrix panel 14.

The matrix panel 14 is installed in the enclosure base 12 using four 1 inch spacers 28, each adapted to receive an 8-32 screw 30, to fasten the matrix panel 14 to the enclosure base back 16. The screws 30 pass through attachment holes 31 in the matrix panel 14, and into the spacers 28. The spacers 28 create a cavity 32 defined by the base sides 18, base back 16 and the matrix panel 14. The cavity 32 is of sufficient depth to accommodate the fractional turn fasteners 24 and wiring harness 29.

The system 10 of the present invention is designed to allow control panel elements to be mounted either individually or in small groupings into modules 34 which can be quickly added to, removed from, or repositioned within a control panel design layout. The particular control panel elements depicted within the various drawings include a lamp 36, a toggle switch 38, a four position switch 40 and a split legend, or square, switch 42. Envisioned, but not illustrated, is the reconfigurable mounting of other control panel elements including but not limited to meters, key pads, and analog devices.

In order to maximize reconfigurability as far as type and location within a certain physical area, the control panel elements are mounted into the modules 34. The modules 34 of the present invention are preferably unitarily formed from a continuous length of aluminum. The modules 34 have a flange or bottom 44 with a plurality of mounting holes 46 drilled at 0.5 inch increments, thereby allowing for a physical reconfiguration of each module 34 at 0.5 inch intervals.

In use, at least one of the mounting holes 46 drilled in the base 44 of the module 34 are aligned with at least one of the apertures 22 disposed in the matrix panel 14. Preferably, two holes 46 in the bottom of the module 34 will align with corresponding apertures 22 in the matrix panel 14, thereby prohibiting the module 34 from rotating. After such alignment is accomplished, a fastener 24 is passed through the aligned apertures 22, 46, thereby serving to removably mount the module 34 to the matrix panel 14.

A particular module 34 can accommodate any number of various control panel elements. Referring to FIG. 1, illustrated is a module 34a having a top 48a with a round cut-out 50. Such a round cut-out 50 accommodates a wide variety of toggle switches, round push buttons, and indicator lamps. In the preferred embodiment, the modules 34 are box shaped, and have a standard 2 inch depth.

Further referring to FIG. 1, shown is a module 34b having two rectangular cut-outs 52. The cut-outs 52 are adapted to accommodate control panel elements such as the illustrated split legend push button switch 42 in one cut-out 52, and a similar element in the other cut-out 52. By having multiple portions on a single module 34 adapted to receive control panel elements, ease of reconfigurability is enhanced insofar as control panel elements can be moved in small clusters.

Figure 4:
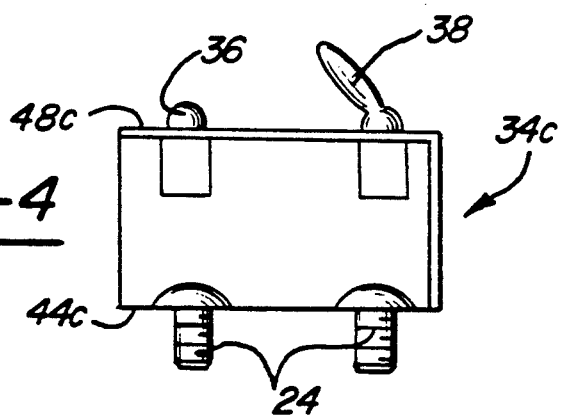
FIG. 4 is a side view of an alternative embodiment of a module of the present invention which incorporates a lamp and a switch.
Figure 5:
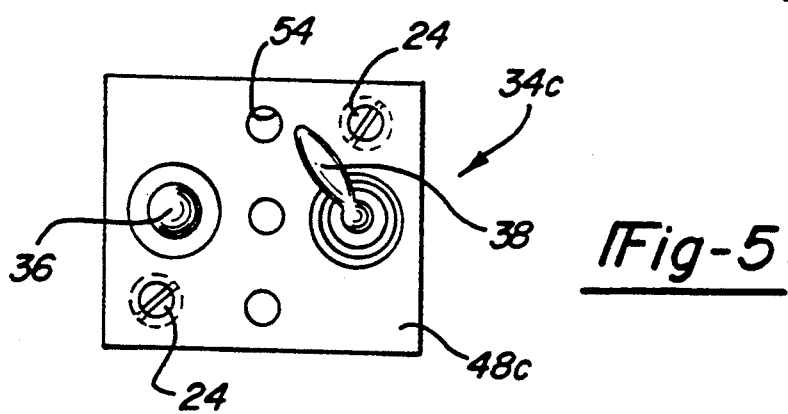
FIG. 5 is a top view of the alternative embodiment of FIG. 4.

Referring now to FIG. 4, illustrated is another embodiment of a module 34c for use in the present system 10. In this embodiment, the module 34c is formed such that the base 44c is disposed directly below the top 48c. The top 48c of this module 34c further is provided with a plurality of access holes 54 to access the heads of the fasteners 24 protruding through holes 46c in base 44c. The access holes 54 should be sufficiently large enough to accommodate a screwdriver. This particular embodiment of the module 34c decreases its footprint thereby maximizing reconfigurability and space efficiency.

The preferred fastener 24 of the system 10 is a captive device such as Southco brand fractional turn fastener which contains a neoprene sleeve (not shown) on its end. Turning the fastener head one-quarter turn activates a cam which compresses the neoprene sleeve within the mounting hole 22, securing the module 34. The fastener 24 has an audible click which reports when the cam becomes fully engaged. Reversing the screw direction releases the fastener 34.

Further in the preferred embodiment, a bezel 62 is provided. After a control panel configuration has been developed, a bezel 62 with cut-outs 69 therein is constructed from materials such as 0.125" ABS plastic, foam core or cardboard can be fabricated to cover the assembly. Control panel element names or positions can then be added by way of silk screening or dry transfer letters in order to facilitate element identification. A slight overlap of the bezel 62 beyond the sides 18 of the base enclosure 12 is preferred. Each side 18 of the enclosure base 12 has a lip 64. The bezel 62 is attached to the lip 64 with 4-40 bezel screws 63 passing through holes 65 and 67 in lip 64 and bezel 62, respectively.

Turning attention to FIG. 6, illustrated is the preferred embodiment of the electrical interface 56 for the present system. The electrical interface 56 includes signal conditional circuitry 58 and an interface control computer 60. The interface control computer 60 includes discrete input and output modules, analog input and output modules, and interface control software.

In the preferred embodiment, as shown in FIG. 6, computer simulation is accomplished in a separate computer. In an alternative embodiment, a single computer is provided which has the appropriate hardware and software devices, and sufficient processing capabilities to run both the simulator software and the interface control software.

The system 10 of the present invention is a natural step in the development of products to aid in the design and development of user interface equipment. This technology should be applicable to the design of control panels for military applications as well as commercial applications, such as the design of dashboards in automobiles and the design of controls in the nuclear industry. This product may also find application in any industry which designs control layouts and/or studies the effects of layouts on operation by humans.

The present invention provides flexible and inexpensive means to design and experiment with the layout of control panel elements in a high-fidelity environment.

Although this invention has been described in detail with reference to certain preferred embodiments and specific examples, variations and modifications exist within the scope and spirit of the invention as described and defined in the claims. For example, it is envisioned that the modules 34 of the system 10 could be redesigned to accommodate less traditional control panel elements. This alternative construction should fall within the spirit of the invention.

While the above description constitutes the preferred embodiment of the invention, it will be appreciated that the invention is susceptible to modification, variation, and change without departing from the proper scope or fair meaning of the accompanying claims.

What is claimed is:

1. A system for designing control panels having a variety of configurations, comprising:
   a base;
   a matrix panel comprising a two-dimensional array of apertures having a first predetermined spacing between individual apertures mounted to said base;

a module having a top that is adapted to receive a control panel element, and comprising a bottom portion comprising an array of holes having a second predetermined spacing between individual holes that are alignable with substantially all apertures of the two-dimensional array of apertures in said matrix panel to provide for a variety of alternative orientations and locations of the module on the matrix panel, and wherein said module is relocatably mountable to the matrix panel;

a relocatable control panel element mounted to the top of the module; and fastener means removably mounting the module to the matrix panel by means of selected holes and apertures of the arrays of holes and apertures to provide for reconfigurability of the control panel;

wherein selected fastening of the module to the matrix panel by way of different holes and apertures of the arrays of holes and apertures provides for reconfiguring of the control panel and thus provides a system for designing control panels having variety of configurations.

2. The system of claim 1 wherein said fastener means is projectable through the selected ones of the plurality of holes and apertures to enable removable mounting of the at least one module.

3. The system of claim 2 wherein said fastener means is a captured fractional turn fastener.

4. The system of claim 3 wherein said base further comprises a back, and a first and second pair of laterally spaced sides.

5. The system of claim 4 wherein each side of said first and second pair of sides has at least one aperture provided therein for mounting to a second substantially similar base.

6. The system of claim 5 further comprising a plurality of spacers disposed between said back of said base and said matrix panel, whereby said spacers create a cavity defined by the first and second pairs of laterally spaced sides, the back of the base and the matrix panel.

7. The system of claim 6 further comprising a wiring harness disposed within said cavity.

8. The system of claim 1 wherein said first and second predetermined spacings are different.

9. The system of claim 1 wherein the first predetermined spacing between said holes is two times the second predetermined spacing between said apertures.

10. A reconfigurable control panel system for designing and testing control panels having a variety of configurations, comprising:

a base;

a matrix panel comprising a two-dimensional array of apertures having a first predetermined spacing between individual apertures mounted to said base;

a plurality of relocatable modules, each module having a top that is adapted to receive a selected control panel element, and comprising a bottom portion comprising an array of holes having a second predetermined spacing between individual holes that are alignable with substantially all apertures of the two-dimensional array of apertures in said matrix panel, and wherein said module is removably mountable to the matrix panel;

a plurality of predetermined control panel elements individually mounted to the tops of selected ones of the plurality of modules; and fastener means removably mounting the plurality of modules to the matrix panel by means of selected holes and apertures of the arrays of holes and apertures to provide for reconfigurability of the control panel;

wherein selected fastening of the plurality of modules to the matrix panel using different holes and apertures of the arrays of holes and apertures provides for reconfiguring of the control panel and thus provides a system for designing control panels having variety of configurations.

11. The system of claim 10 wherein said base further comprises a back, and a first and second pair of laterally spaced sides.

12. The system of claim 11 wherein each side of said first and second pair of sides has at least one aperture provided therein for mounting to a second substantially similar base.

13. The system of claim 12 further comprising a plurality of spacers disposed between said back of said base and said matrix panel, whereby said spacers create a cavity defined by the first and second pairs of laterally spaced sides, the back of the base and the matrix panel.

14. The system of claim 13 further comprising a wiring harness disposed within said cavity.

15. The system of claim 10 wherein said fastener means is a captured fractional turn fastener.

16. The system of claim 10 wherein said first and second predetermined spacings are different.

17. The system of claim 10 wherein the first predetermined spacing between said holes is two times the second predetermined spacing between said apertures.

* * * * *